US010959545B2

(12) United States Patent
Ina et al.

(10) Patent No.: US 10,959,545 B2
(45) Date of Patent: Mar. 30, 2021

(54) IMAGE DISPLAY DEVICE

(71) Applicant: PANASONIC INTELLECTUAL PROPERTY MANAGEMENT CO., LTD., Osaka (JP)

(72) Inventors: Tatsuya Ina, Osaka (JP); Tadahiro Kugimaru, Osaka (JP); Ryouji Onishi, Osaka (JP); Jun Araya, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/630,375

(22) PCT Filed: Mar. 28, 2019

(86) PCT No.: PCT/JP2019/013829
§ 371 (c)(1),
(2) Date: Jan. 10, 2020

(87) PCT Pub. No.: WO2019/189673
PCT Pub. Date: Oct. 3, 2019

(65) Prior Publication Data
US 2020/0128976 A1  Apr. 30, 2020

(30) Foreign Application Priority Data
Mar. 30, 2018  (JP) .............. JP2018-069020

(51) Int. Cl.
*A47F 11/10* (2006.01)
*A47F 5/00* (2006.01)
(Continued)

(52) U.S. Cl.
CPC ............ *A47F 11/10* (2013.01); *A47F 5/0043* (2013.01); *F21V 11/02* (2013.01); *F21V 23/003* (2013.01);
(Continued)

(58) Field of Classification Search
CPC .......... A47F 3/005; A47F 3/007; A47F 11/10
See application file for complete search history.

(56) References Cited

U.S. PATENT DOCUMENTS

2012/0105424 A1  5/2012  Lee et al.
2013/0063326 A1  3/2013  Riegel
(Continued)

FOREIGN PATENT DOCUMENTS

JP  2013-156635 A  8/2013
JP  2014-503835 A  2/2014
(Continued)

OTHER PUBLICATIONS

International Search Report and Written Opinion dated Jun. 4, 2019 in International Application No. PCT/JP2019/013829; with partial English translation.

*Primary Examiner* — Sean P Gramling
(74) *Attorney, Agent, or Firm* — McDermott Will and Emery LLP

(57) ABSTRACT

An image display device includes an image display unit including a display panel, a shelf board, and an illumination unit. The display panel is switchable between an image display mode in which an image is displayed and a transmissive mode in which the display panel is in a transmissive state where objects behind image display unit is visible in a front view of the display panel. The shelf board is disposed projecting rearward from the rear surface of image display unit, and extends in the lateral direction. The illumination unit is disposed above the shelf board and emits light downward.

8 Claims, 12 Drawing Sheets

(51) Int. Cl.
   *F21V 11/02*   (2006.01)
   *F21V 23/00*   (2015.01)
   *H01L 27/32*   (2006.01)
   *F21Y 115/10*  (2016.01)
   *G09F 9/35*    (2006.01)

(52) U.S. Cl.
   CPC ....... *H01L 27/3239* (2013.01); *F21Y 2115/10* (2016.08); *G09F 9/35* (2013.01)

(56) References Cited

U.S. PATENT DOCUMENTS

| | | |
|---|---|---|
| 2013/0194167 A1 | 8/2013 | Yun et al. |
| 2015/0170608 A1* | 6/2015 | Kim .................. G09F 23/0058 345/592 |
| 2018/0061283 A1 | 3/2018 | Kim et al. |

FOREIGN PATENT DOCUMENTS

| | | |
|---|---|---|
| JP | 2014-509528 A | 4/2014 |
| JP | 2016-173418 A | 9/2016 |
| WO | 2012/057457 A1 | 5/2012 |
| WO | 2012/119109 A1 | 9/2012 |

* cited by examiner

FIG. 8

| OPERATION MODE | | IMAGE DISPLAY | LIGHT CONTROL SHEET | ILLUMINATION UNIT |
|---|---|---|---|---|
| IMAGE DISPLAY MODE | | ON | OFF(NOT TRANSMISSIVE) | OFF |
| TRANSMISSIVE MODE | FIRST TRANSMISSIVE MODE | OFF | ON(TRANSMISSIVE) | ON |
| | SECOND TRANSMISSIVE MODE | ON | ON(TRANSMISSIVE) | ON |

IMAGE DISPLAY DEVICE

CROSS-REFERENCE OF RELATED APPLICATIONS

This application is the U.S. National Phase under 35 U.S.C. § 371 of International Patent Application No. PCT/JP2019/013829, filed on Mar. 28, 2019, which in turn claims the benefit of Japanese Application No. 2018-069020, filed on Mar. 30, 2018, the entire disclosures of which Applications are incorporated by reference herein.

TECHNICAL FIELD

The present disclosure relates to an image display device which includes a display panel operable in a transmissive mode.

BACKGROUND ART

Patent Literature (PTL) 1 discloses a display device which includes a transparent display. The display device includes: a first panel which performs display with use of transparent organic light-emitting diode (OLED) elements; a second panel which includes polymer-dispersed liquid crystals, is disposed on the rear surface of the first panel, and shields or transmits light from the back; and a controller which switches the second panel between a transparent state and an opaque state. The display device makes the second panel transparent, so that an image of each object behind the first panel and an image on the first panel can be simultaneously viewed. Moreover, it is possible to display a clear image with a high contrast with no intervention of outdoor light from the back of the first panel by making the second panel opaque.

CITATION LIST

Patent Literature

PTL 1: Japanese Unexamined Patent Application Publication No. 2013-156635

SUMMARY OF THE INVENTION

Technical Problem

The present disclosure provides an image display device which is capable of effectively using a display panel operable in a transmissive mode.

Solution to Problem

An image display device according to the present disclosure includes: an image display unit which includes a display panel switchable between an image display mode and a transmissive mode, the image display mode being a mode in which an image is displayed, the transmissive mode being a mode in which the display panel is in a transmissive state where an object behind the image display unit is visible in a front view of the display panel; a shelf board which is disposed projecting rearward from a rear surface of the image display unit, the shelf board extending in a lateral direction; and an illumination unit which is disposed above the shelf board and emits light downward.

Advantageous Effect of Invention

An image display device according to the present disclosure is capable of effectively using a display panel operable in a transmissive mode.

BRIEF DESCRIPTION OF DRAWINGS

FIG. 8 illustrates a table in which the states of the display panel and the illumination unit of the image display device according to Embodiment 1 are summarized for each operation mode.

DESCRIPTION OF EXEMPLARY EMBODIMENTS

Figure 1:
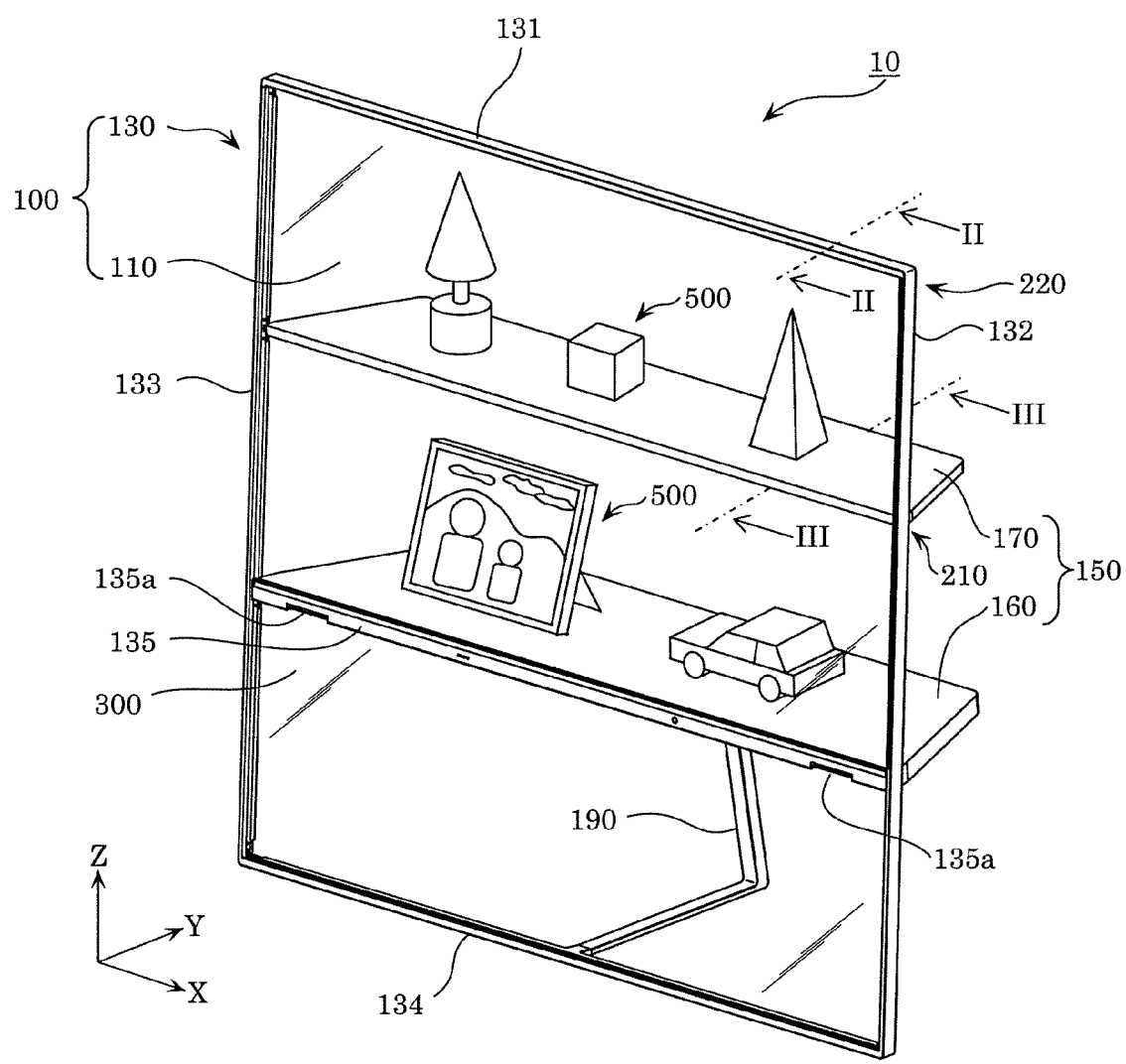
FIG. 1 is an external perspective view of a state of an image display device according to Embodiment 1 when operating in a first transmissive mode.

The inventors of the present application have found the following problems in a conventional image display device. As in the conventional transparent display, a display panel, which is switchable between a state in which an image is displayed and a transmissive state, for example, includes: an organic EL panel including a plurality of organic EL elements disposed on a glass substrate; and a light control sheet which switches between light transmittance and light non-transmittance according to whether or not voltage is applied to polymer-dispersed liquid crystals.

In such a display panel, for example, by not displaying an image on an organic EL panel and turning on the light control sheet (making the light control sheet the transmissive state), it is possible to allow a user in front of the display panel to view objects behind the display panel. However, the organic EL panel includes a plurality of organic EL elements arranged in a matrix and the light control sheet includes dispersed liquid crystals. In other words, although the base material of the display panel is a transparent material such as a glass, minute light shielding elements, such as organic EL elements and liquid crystals, are dispersed in the display panel. Accordingly, for the user who views the display panel from the front side, the back side of the display panel may look dark. That is, the transmittance of the display panel when the display panel operates in a transmissive mode may be insufficient for viewing of objects behind the display panel. Of course, by placing the image display device in a bright environment, the back side of the image display device also becomes bright. As a result, it is possible to allow the user to view the objects behind the image display device clearly. However, in this case, when an image is displayed on the display panel, the image may not be viewed properly due to, for example, reflection or transmittance of environmental light on the display panel.

The present disclosure has been conceived based on such finding. As a result of intensive studies by the inventors of the present application, the inventors have arrived at an idea of a configuration and control of an image display device which is capable of effectively using a display panel which operates in a transmissive mode.

Hereinafter, embodiments will be described with reference to the drawings as necessary. Note that unnecessarily detailed descriptions may be omitted. For example, detailed descriptions of already known matters and overlapping description of substantially the same configuration may be omitted. This is to avoid the following description to become unnecessarily redundant, and to facilitate understanding of the person skilled in the art.

The inventors of the present application provide the accompanying drawings and the following description so that the person skilled in the art fully understands the present disclosure, and do not intend to limit the subject matter of the claims by this.

Moreover, in the following embodiments, the top-bottom direction is represented by a Z-axis, the front-back direction is represented by a Y-axis, and the left-right direction is represented by an X-axis for the sake of description, but these do not limit the orientation of the image display device according to the present disclosure at the time of manufacture or usage. In the following descriptions, for example, an X-plus axis indicates the direction of the arrow of the X-axis and an X-minus axis indicates the direction opposite of the X-plus axis. The same applies to the Y-axis and the Z-axis.

Moreover, in the following embodiments, language such as parallel or perpendicular may be used to indicate the relative orientation of two directions, but this includes cases where the orientation is not as exactly stated. For example, "two directions are parallel" includes substantially parallel, that is to say, for example, includes a margin of error of about a few percent, unless otherwise noted, in addition to exactly parallel.

Embodiment 1

Hereinafter, Embodiment 1 will be described with reference to FIG. 1 to FIG. 10. First, with reference to FIG. 1 to FIG. 4, outline of a configuration of an image display device according to Embodiment 1 will be described.

1-1. Outline of Configuration of Image Display Device

Figure 2:
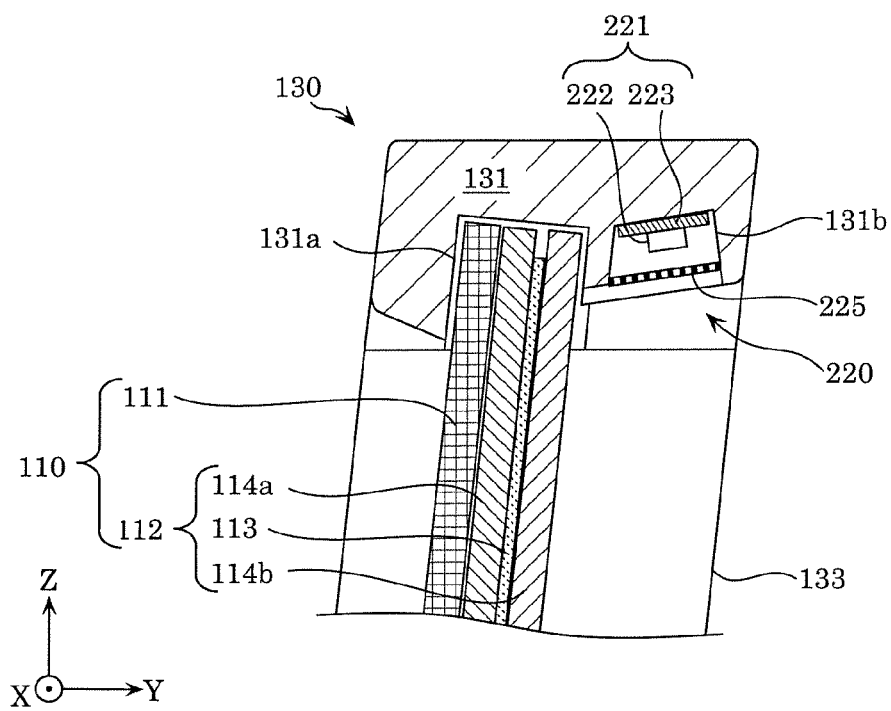
FIG. 2 is a cross-sectional view of a schematic configuration of a display panel and an upper illumination unit according to Embodiment 1.
Figure 3:
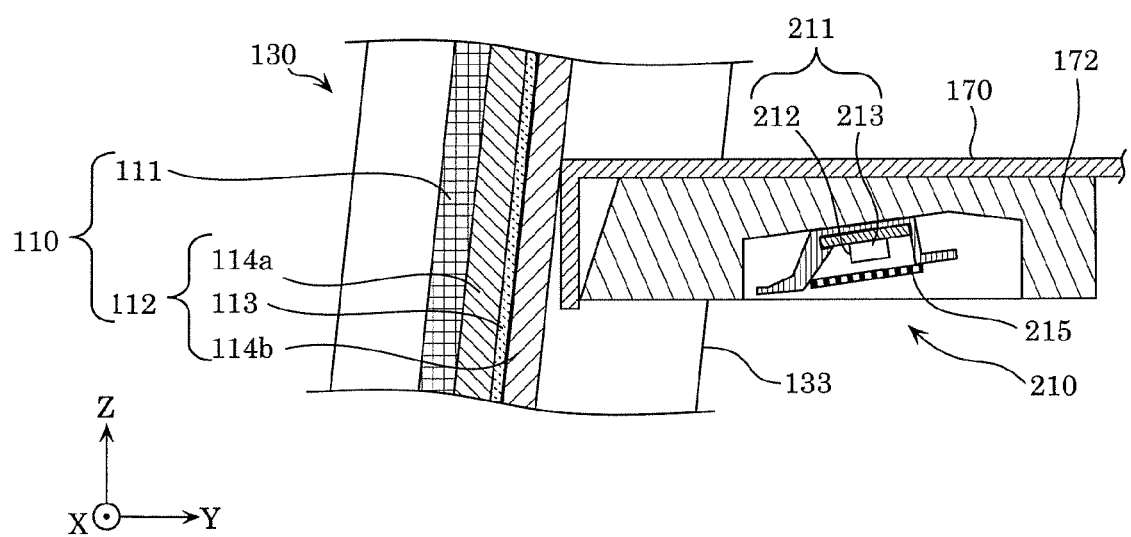
FIG. 3 is a cross-sectional view of a schematic configuration of the display panel and a lower illumination unit according to Embodiment 1.
Figure 4:
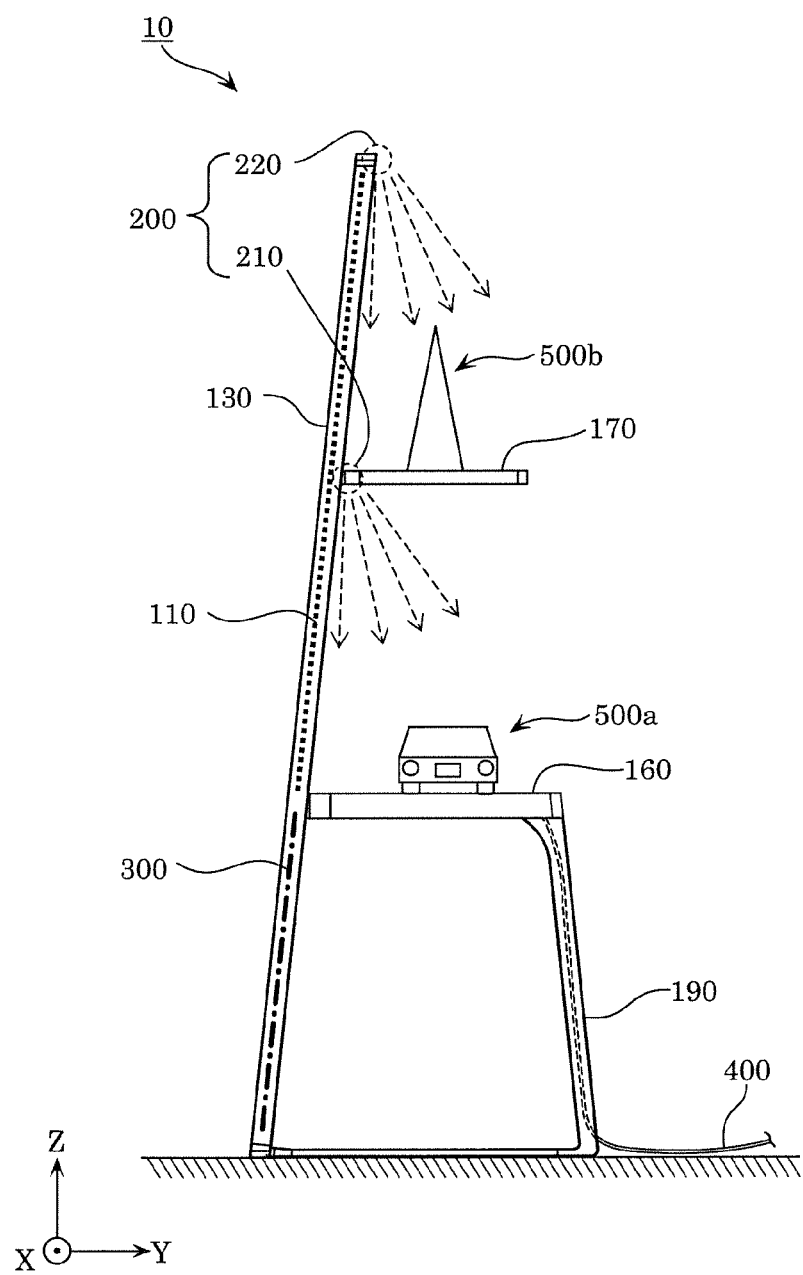
FIG. 4 is a side view of the image display device according to Embodiment 1.

FIG. 1 is an external perspective view of a state of image display device 10 according to Embodiment 1 when operating in a first transmissive mode. FIG. 2 is a cross-sectional view of a schematic configuration of display panel 110 and upper illumination unit 220 according to Embodiment 1. Specifically, FIG. 2 illustrates a cross-section taken along line II-II in FIG. 1. FIG. 3 is a cross-sectional view of a schematic configuration of display panel 110 and lower illumination unit 210 according to Embodiment 1. Specifically, FIG. 3 illustrates a portion of a cross-section taken along line III-III in FIG. 1. FIG. 4 is a side view of image display device 10 according to Embodiment 1. In FIG. 4, approximate positions of display panel 110 and light transmissive panel 300 are indicated by dashed lines and dashed-dotted lines.

As illustrated in FIG. 1 to FIG. 4, image display device 10 according to the present embodiment includes: image display unit 100 including display panel 110 and frame 130 supporting display panel 110; shelf board 150; illumination unit 200; and light transmissive panel 300 supported by frame 130.

In the present embodiment, frame 130 includes T frame 131, R frame 132, L frame 133, B frame 134, and M frame 135. T frame 131 is disposed along the top side of display panel 110. R frame 132 is disposed along the right side of display panel 110 in the front view. L frame 133 is disposed along the left side of display panel 110 in the front view. B frame 134 is disposed along the bottom side of light transmissive panel 300. M frame 135 is disposed between display panel 110 and light transmissive panel 300. In other words, M frame 135 is disposed across R frame 132 and L frame 133. Each of these partial frames (131 to 135) is mechanically connected to other adjacent partial frames.

As the material of frame 130, for example, metal such as aluminum or aluminum alloy is used. Accordingly, for example, it is possible to obtain frame 130 with relatively light weight and high strength. Moreover, frame 130 can also function as a heat dissipation member which dissipates heat generated by illumination unit 200 and the like to the outside.

With frame 130 having the above configuration, display panel 110 is supposed by T frame 131, R frame 132, L frame 133, and M frame 135. Moreover, light transmissive panel 300 is supported by M frame 135, R frame 132, L frame 133, and B frame 134. Note that frame 130 is not necessarily divided into five members as described above. For example, frame 130 may be formed of two members of a rectangular ring-shaped frame corresponding to T, R, L, B frames (131 to 134) and M frame 135.

Display panel 110 is a display device switchable between an image display mode in which an image is displayed and a transmissive mode in which display panel 110 is in a transmissive state where each of objects behind image display unit 100 is visible in the front view of display panel 110. Specifically, as illustrated in FIG. 2 and FIG. 3, display panel 110 includes organic electro-luminescence (EL) panel 111 and light control panel 112 disposed behind organic EL panel 111. Note that the "image" displayed on display panel 110 may be any of a still image or a moving image, or may be video content including both the still image and the moving image.

In the present embodiment, organic EL elements, which includes an EL layer and transparent electrodes sandwiching the EL layer, are disposed in a matrix in organic EL panel 111. The region of organic EL panel 111 where an image (including background image) is not displayed has light transmitting properties to the extent generally referred to as transparent.

Moreover, light control panel 112 includes light control sheet 113, first glass plate 114a disposed in front of light control sheet 113, and second glass plate 114b disposed behind light control sheet 113. Light control sheet 113 is a member switchable between a light transmissive state and a light non-transmissive state depending on whether or not a predetermined voltage is applied to light control sheet 113. Light control sheet 113 includes, for example, a liquid crystal layer including liquid crystal molecules having an orientational state changed by presence or absence of an application of voltage, and resin sheets sandwiching the liquid crystal layer.

Display panel 110, configured such that organic EL panel 111 and light control panel 112 are layered, becomes, for example, as illustrated in FIG. 1, a transmissive state, in which objects 500 behind image display unit 100 are visible, by not displaying an image on organic EL panel 111 and applying a predetermined voltage to light control sheet 113 (turning on light control sheet 113). In the present embodiment, this operation mode is referred to as a transmissive mode.

More specifically, the case where display panel 110 operates in the transmissive mode includes a case where an image is not displayed on organic EL panel 111 as illustrated in FIG. 1 and a case where an image is displayed on a portion of organic EL panel 111. Accordingly, in order to distinguish these operation modes from each other, the case where an image is not displayed on organic EL panel 111 as illustrated in FIG. 1 is referred to as a first transmissive mode, and the case where an image is displayed on a portion of organic EL panel 111 is referred to as a second transmissive mode. The second transmissive mode will be described later with reference to FIG. 7. Moreover, display panel 110 may include, for example, an optical element such as an antireflection film in addition to the above structural elements.

Shelf board 150 is disposed on the rear surface of image display unit 100 including display panel 110, so as to project rearward. In the present embodiment, as illustrated in FIG. 1, shelf board 150 includes upper shelf board 170 and lower shelf board 160. Upper shelf board 170 is an example of a first shelf board, and lower shelf board 160 is an example of a second shelf board. Upper shelf board 170 and lower shelf board 160 are fixed to frame 130. Moreover, as illustrated in FIG. 1 and FIG. 4, lower shelf board 160 is supported by support member 190 from below. Support member 190 houses electric wire 400 electrically connected to a controller or the like housed in lower shelf board 160, as will be described later with reference to FIG. 5.

On each of upper shelf board 170 and lower shelf board 160, objects 500 (such as a photograph, a doll, a vase, a toy, a model, or a drawing) can be placed. In the case where display panel 110 operates in the first transmissive mode, a user is capable of viewing objects 500 placed on upper shelf board 170 and lower shelf board 160 through display panel 110.

In front of lower shelf board 160, M frame 135 is disposed across R frame 132 and L frame 133. M frame 135 has a pair of openings 135a where sound emitted from a pair of loudspeaker devices housed in lower shelf board 160 exits. Although not illustrated, a sheet with the same pattern as lower shelf board 160 (such as wood pattern sheet) is pasted to the front surface of M frame 135, for example. Accordingly, M frame 135 is recognized as if it is part of lower shelf board 160 in appearance. Moreover, the sheet has, at positions of openings 135a, a plurality of minute holes, for example, so as not to prevent emittance of sound from openings 135a.

Moreover, M frame 135 also functions to support the upper end of light transmissive panel 300. Light transmissive panel 300 is disposed below display panel 110, and is an example of a plate-shaped light transmissive member through which objects placed behind image display unit 100 are visible. Light transmissive panel 300 is, for example, realized by a glass plate. More specifically, light transmissive panel 300 has a light transmittance approximately the same as the light transmittance of display panel 110 when operating in the transmissive mode. Moreover, the color of light transmissive panel 300 is also adjusted to be close to the color of display panel 110 operating in the transmissive mode. Accordingly, when display panel 110 is operating in the transmissive mode, appearance of display panel 110 and light transmissive panel 300 is recognized as if it is a continuous glass plate including two tiers of top and bottom shelf boards on the rear surface.

As described above, display panel 110 includes minute light shielding elements, such as organic EL elements and liquid crystals, which are dispersedly arranged. Hence, even when display panel 110 operates in the first transmissive mode, the light transmittance of display panel 110 is, for example, 40% to 50% approximately. Accordingly, for example, when image display device 10 is placed in a relatively dark environment, the user may fail to clearly view objects 500 placed behind display panel 110.

However, image display device 10 according to the present embodiment includes illumination unit 200. Each object 500 placed behind display panel 110 can be illuminated with the light emitted from illumination unit 200.

Specifically, illumination unit 200 according to the present embodiment includes, as illustrated in FIG. 2 to FIG. 4, upper illumination unit 220 and lower illumination unit 210. Upper illumination unit 220 is an example of a first illumination unit, and lower illumination unit 210 is an example of a second illumination unit.

Upper illumination unit 220 is disposed at the upper end portion of the rear surface of image display unit 100. Specifically, as illustrated in FIG. 2, T frame 131 has holding groove 131a which holds the upper end portion of display panel 110 and illumination groove 131b to which upper illumination unit 220 is attached. Upper illumination unit 220 includes light source unit 221 which emits light, and micro-louver 225 disposed on the light-emitting side of light source unit 221. Micro-louver 225 is an example of an optical element which limits the distribution angle of light emitted from light source unit 221. Upper illumination unit 220 is embedded in illumination groove 131b. Accordingly, when display panel 110 is in the transmissive state, the light emitted from upper illumination unit 220 is not likely to directly enter the eyes of the user in front of image display device 10.

Light source unit 221 includes substrate 223 long in the X-axis direction and a plurality of LED elements 222 mounted on substrate 223. Micro-louver 225 is a member disposed along light source unit 221 and long in the X-axis direction, and has a configuration in which light shields and light transmitting bodies extended in the X-axis direction are alternately arranged in the short direction of micro-louver 225. A more specific configuration example of micro-louver 225 will be described later with reference to FIG. 9 and FIG. 10.

Lower illumination unit 210 is disposed at the base portion of upper shelf board 170. Specifically, as illustrated in FIG. 3, attachment member 172 for attaching lower illumination unit 210 is disposed on the bottom surface of the end portion of upper shelf board 170 on the frame 130 side. Lower illumination unit 210 is fixed to upper shelf board 170 via attachment member 172.

Lower illumination unit 210 has a configuration and features common to those of upper illumination unit 220. In other words, lower illumination unit 210 includes light source unit 211 which emits light, and micro-louver 215 disposed on the light-emitting side of light source unit 211. Micro-louver 215 is an example of an optical element which limits the distribution angle of light emitted from light source unit 211.

Light source unit 211 includes substrate 213 long in the X-axis direction and a plurality of LED elements 212 mounted on substrate 213. Micro-louver 215 is a member disposed along light source unit 211 and long in the X-axis direction, and has a configuration in which light shields and light transmitting bodies extended in the X-axis direction are alternately arranged in the short direction of micro-louver 215.

Micro-louver 225 (215) is capable of limiting the distribution angle of light emitted from LED elements 222 (212) having, for example, a half directivity angle which is 120° approximately, to 60° approximately. Moreover, micro-louver 225 (215) also functions to hide light source unit 221 (211) from the outside and to reduce particulate appearance of light due to the scattering of LED elements 222 (212), for example.

One or more objects 500 placed on shelf board 150 are illuminated by illumination unit 200 configured as above. In other words, as illustrated in FIG. 4, object 500b placed on upper shelf board 170 is illuminated by the light emitted from upper illumination unit 220, and object 500a placed on lower shelf board 160 is illuminated by the light emitted from lower illumination unit 210.

More specifically, in upper illumination unit 220, the distribution angle of light emitted from light source unit 221 is narrowed by micro-louver 225. In other words, the light emitted from upper illumination unit 220 is limited by micro-louver 225 so as to fall within a predetermined range centered on upper shelf board 170 in the Y-axis direction. Accordingly, the amount of light emitted from upper illumination unit 220 and entering display panel 110 is reduced, and, for example, in the front view of display panel 110, the possibility that display panel 110 partially looks white due to the light from upper illumination unit 220 is reduced. Moreover, a state where upper illumination unit 220 unnecessarily illuminates the region behind upper shelf board 170 is unlikely to occur.

In a similar manner, with respect to lower illumination unit 210, the distribution angle of light emitted from light source unit 211 is limited by micro-louver 215. Accordingly, the illuminated range falls within a predetermined range centered on lower shelf board 160. Accordingly, the light emitted from lower illumination unit 210 is unlikely to enter display panel 110. Moreover, a state where lower illumination unit 210 unnecessarily illuminates the region behind lower shelf board 160 is unlikely to occur.

1-2. Lower Shelf Board

Figure 5:
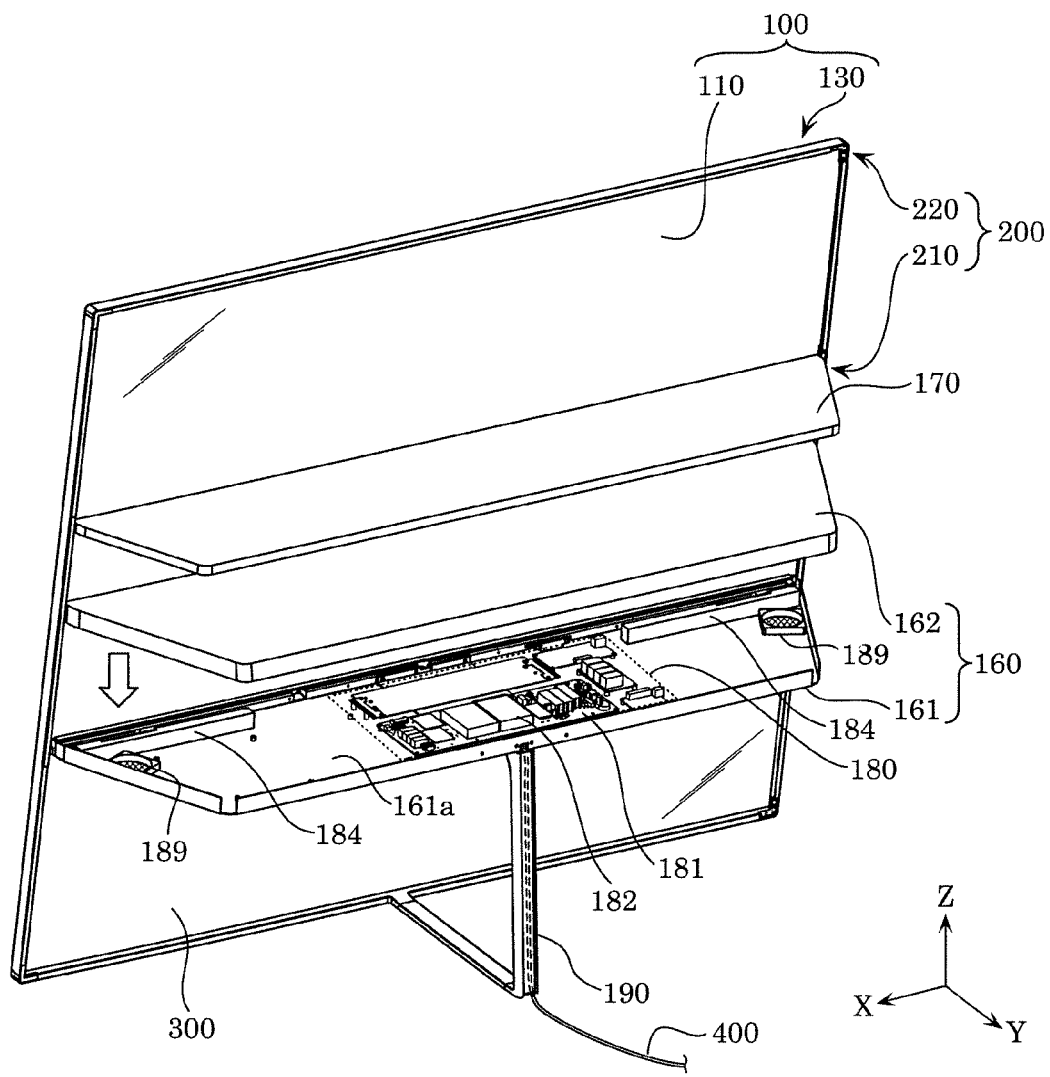
FIG. 5 is an exploded perspective view of a schematic configuration of a lower shelf board according to Embodiment 1.

Next, a configuration of lower shelf board 160 according to the present embodiment will be described with reference to FIG. 5. FIG. 5 is an exploded perspective view of a schematic configuration of lower shelf board 160 according to Embodiment 1. Specifically, FIG. 5 illustrates lower shelf board 160 separated into shelf body 161 and placement surface 162.

In the present embodiment, lower shelf board 160 is an example of a holding member which holds controller 180 in the housed state. Specifically, as illustrated in FIG. 5, controller 180 is housed inside lower shelf board 160. Controller 180 controls operations of display panel 110 and illumination unit 200. Controller 180 includes, for example, one or more circuit substrates 181, and a plurality of electronic components 182 mounted on the one or more circuit substrates 181. Controller 180 is disposed along bottom surface 161a of shelf body 161 so that controller 180 falls within the thickness (width in the Z-axis direction) of lower shelf board 160. In other words, flat plate-shaped controller 180 is housed in lower shelf board 160 in an upright position relative to the rear surface of image display unit 100, in a similar manner to lower shelf board 160.

Moreover, lower shelf board 160 further houses loudspeaker devices which emit sound from the front side of image display unit 100. In the present embodiment, for example, a pair of loudspeaker devices 184 for outputting 2-channel stereophonic audio are housed inside lower shelf board 160. In front of the pair of loudspeaker devices 184, as described above, there are openings 135a formed in M frame 135. The sound output from loudspeaker devices 184 is emitted to the front of image display device 10 via openings 135a. In such a manner, in the present embodiment, lower shelf board 160 holding controller 180 also functions as a member which hides controller 180 and loudspeaker devices 184.

Lower shelf board 160 further includes two exhaust fans 189 for cooling the devices housed inside lower shelf board 160, such as controller 180 and loudspeaker devices 184. By driving these two exhaust fans 189, for example, outside air is introduced into lower shelf board 160 via holes or gaps formed in lower shelf board 160, and cools controller 180, loudspeaker devices 184, and the like, and is discharged to the outside through two exhaust fans 189.

The elements housed in lower shelf board 160 are not limited to devices such as controller 180 and loudspeaker devices 184, but, for example, a television tuner and an optical disk player not illustrated may be housed.

As described above, lower shelf board 160 holding controller 180 and loudspeaker devices 184 is supported by support member 190 from below. This increases the withstand load of lower shelf board 160. Accordingly, for example, it is possible to increase the number of or weight of the elements (such as controller 180) housed in lower shelf board 160. Moreover, support member 190 houses electric wire 400 electrically connected at least to controller 180. Electric wire 400 is, for example, a power cable connected to a commercial power supply, or a signal cable connected to an external audio visual (AV) apparatus. Support member 190 may house a plurality of electric wires 400. In other words, support member 190 which supports lower shelf board 160 from below can be used, for example, as a member which hides electric wire 400 for supplying electric power and/or various signals to controller 180. Moreover, support member 190 can also be used, for example, as a member which bundles a plurality of electric wires 400.

1-3. Operation Example of Image Display Device

Figure 6:
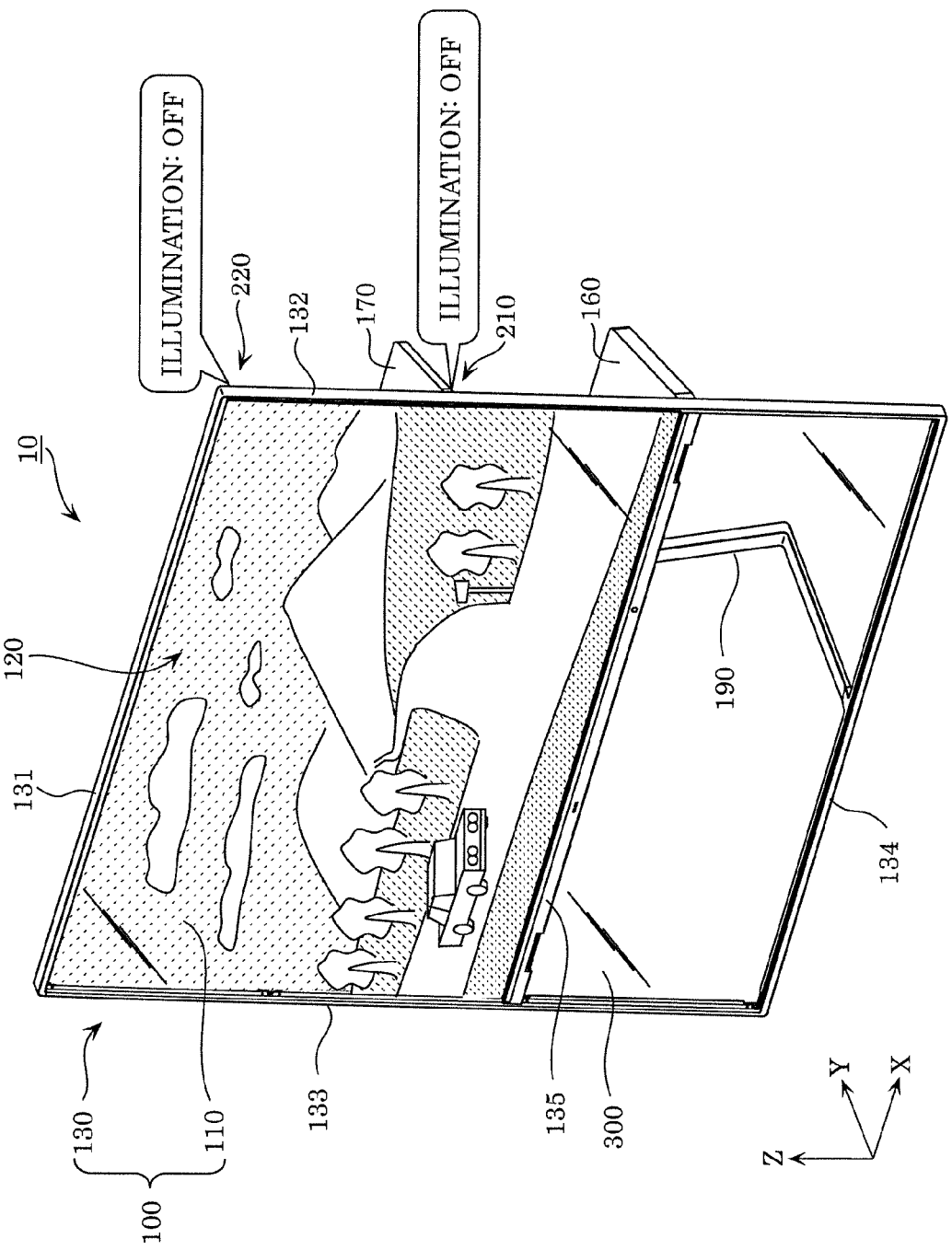
FIG. 6 is an external perspective view of a state of the image display device according to Embodiment 1 when operating in an image display mode.
Figure 7:
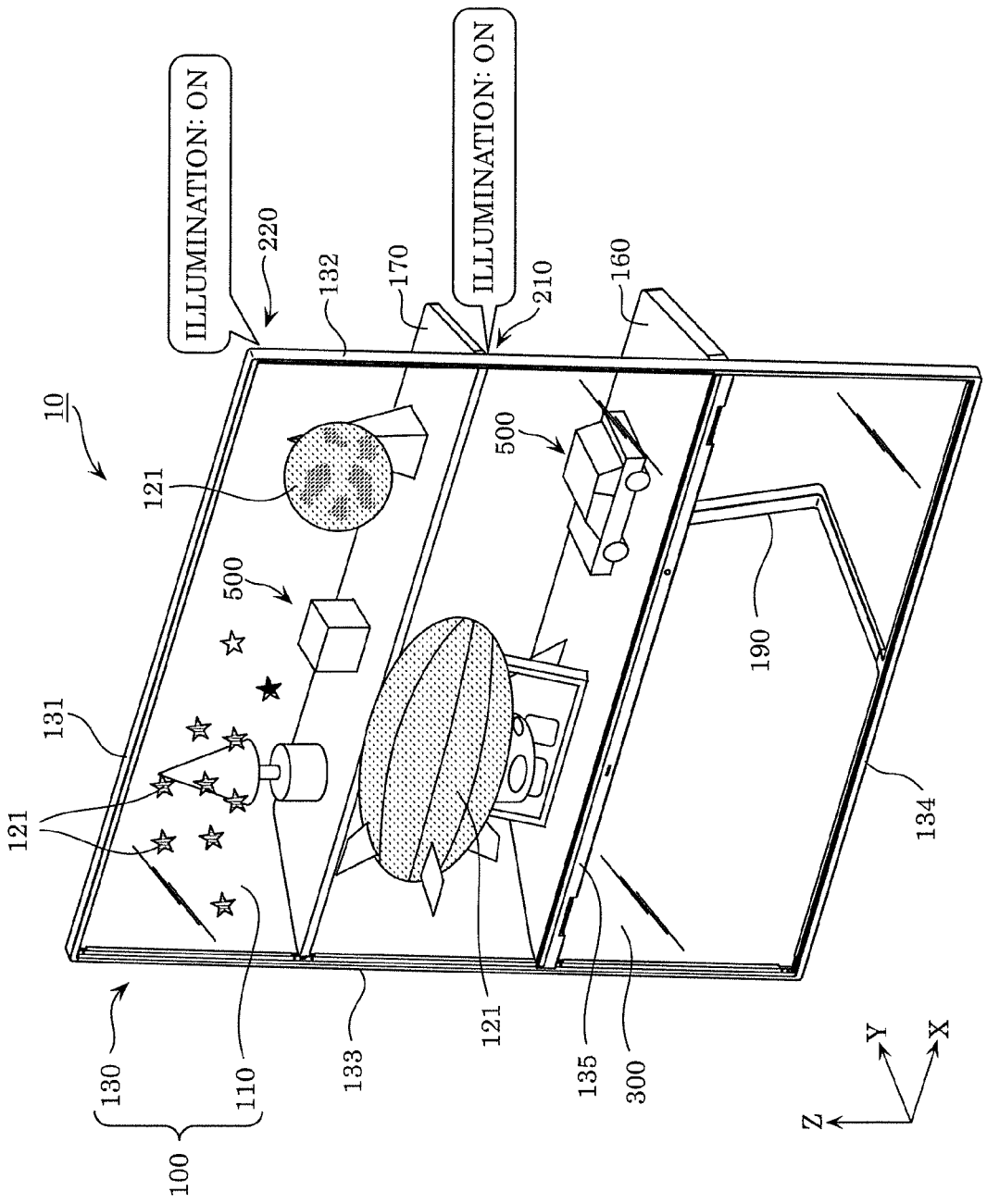
FIG. 7 is an external perspective view of a state of the image display device according to Embodiment 1 when operating in a second transmissive mode.

An operation example of image display device 10 configured as above will be described with reference to FIG. 6 to FIG. 8. FIG. 6 is an external perspective view of image display device 10 according to Embodiment 1 when operating in an image display mode. FIG. 7 is an external perspective view of image display device 10 according to Embodiment 1 when operating in a second transmissive mode. FIG. 8 illustrates a table in which the states of the display panel and the illumination unit of image display device 10 according to Embodiment 1 are summarized for each operation mode.

Switching of the operation modes between the above described first transmissive mode (see FIG. 1), an image display mode and a second transmissive mode to be described below, is performed by, for example, a dedicated remote controller for operating image display device 10 or a general-purpose mobile terminal or based on a control signal from an AV apparatus or the like which supplies image data to image display device 10. Moreover, for example, controller 180 of image display device 10 may switch the operation mode based on information added to the image data.

As illustrated in FIG. 6, image display device 10 operates in an image display mode in which image 120 is displayed on display panel 110. More specifically, controller 180 displays image 120 on the entire image display region of organic EL panel 111, and turns off light control sheet 113 of light control panel 112 (making light control sheet 113 a non-transmissive state). Moreover, controller 180 turns off illumination unit 200 (upper illumination unit 220 and lower illumination unit 210). Accordingly, entrance of light coming from the rear surface of organic EL panel 111 is shielded by light control sheet 113, and illumination of light by illumination unit 200 is stopped. As a result, image 120 displayed on display panel 110 is displayed clearly without being influenced by the light emitted from the rear side of display panel 110.

The image data corresponding to the image displayed on display panel 110 is supplied to controller 180 from the television tuner housed in lower shelf board 160 or the AV apparatus or the like connected to electric wire 400. Controller 180 drives organic EL panel 111 based on the supplied image data, so that an image is displayed on display panel 110. The supply source of the image data is not particularly limited. For example, image data may be read by controller 180 from a hard disk or a semiconductor memory connected to image display device 10. Moreover, controller 180 may obtain image data from a personal computer, a tablet, a smart phone or the like, via wireless communication in accordance with a predetermined standard such as Bluetooth (registered trademark) or Wi-Fi (registered trademark).

Moreover, for example, the expression "turns off light control sheet 113 when the operation mode is switched" means if light control sheet 113 is off before switching of the operation mode, light control sheet 113 is maintained off. The same applies to the expression "turns on light control sheet 113", and also applies to on and off of other devices such as illumination unit 200.

Moreover, as illustrated in FIG. 7, image display device 10 operates in a second transmissive mode in which display panel 110 is in a transmissive state and an image is displayed on display panel 110. In other words, in the first transmissive mode illustrated with reference to FIG. 1, an image is not displayed on display panel 110 and the entire screen is in a transmissive state. In contrast, in the second transmissive mode, a portion of display panel 110 is in a transmissive state, and images (partial images 121) are displayed on the other portions of image display panel 110.

In the second transmissive mode, controller 180 displays partial images 121 on a portion of the image display region of organic EL panel 111, and turns on light control sheet 113 of light control panel 112 (making light control sheet 113 a transmissive state). Moreover, controller 180 turns on illumination unit 200 (upper illumination unit 220 and lower illumination unit 210). Accordingly, the user is capable of viewing objects 500 placed on shelf board 150 through a region of organic EL panel 111 where no partial image 121 is being displayed. Moreover, at this time, objects 500 placed on shelf board 150 are illuminated with light from illumination unit 200. Accordingly, even when image display device 10 is placed in a relatively dark environment, the user is capable of viewing objects 500 clearly.

Moreover, for example, it is possible to allow the user to view partial images 121 as well as objects 500 placed on shelf board 150. Hence, for example, it is possible to provide augmented reality (AR) video to the user by a combination of objects 500 and partial images 121.

Each of one or more partial images 121 may be any one of a moving image and a still image. Moreover, even if partial image 121 itself is any of the moving image and the still image, the position of partial image 121 on display panel 110 may be constant, or may vary.

The image data for displaying one or more partial images 121 on display panel 110 is supplied to controller 180 from a television tuner, an AV apparatus, a personal computer, or the like, in a similar manner to image 120 in the image display mode (see FIG. 6).

As described above, image display device 10 is capable of operating in the image display mode and the transmissive mode (first transmissive mode and second transmissive mode). The states (operation details) of display panel 110 and illumination unit 200 in each operation mode are summarized as in FIG. 8.

In other words, when image display device 10 operates in an image display mode in which an image is displayed on the entire screen, an image is displayed on organic EL panel 111 (image display is on), light control sheet 113 is off (not transmissive), and illumination unit 200 is also off (turned off). Accordingly, for example, the user is capable of watching normal television broadcast or movies or the like played on an AV apparatus on image display device 10 with an appropriate image quality.

Moreover, when image display device 10 operates in a first transmissive mode in which an image is not displayed, an image is not displayed on organic EL panel 111 (image display is off), light control sheet 113 is on (transmissive), and illumination unit 200 is also on (turned on). Accordingly, for example, the user is capable of clearly viewing, through display panel 110, one or more objects 500 placed on shelf board 150 of image display device 10.

Moreover, when image display device 10 operates in a second transmissive mode in which an image is displayed only on a portion thereof, an image is displayed only on a portion of the image display region of organic EL panel 111 (image display is on), light control sheet 113 is on (transmissive), and illumination unit 200 is also on (turned on). Accordingly, for example, the user is capable of viewing virtual objects (partial images 121 (see FIG. 7) displayed on display panel 110 and one or more real objects 500 placed on shelf board 150 within the same screen at the same time.

In this manner, when image display device 10 according to the present embodiment operates in a transmissive mode (first transmissive mode and second transmissive mode) in which light control sheet 113 is in a transmissive state, controller 180 turns on illumination unit 200. In other words, the transmissive mode is an operation mode in which each object 500 behind display panel 110 is visible through at least a portion of display panel 110. In this case, controller 180 causes illumination unit 200 to emit light by turning on illumination unit 200. Accordingly, it is possible to improve the clarity of objects 500 in the front view of display panel 110 and the clarity of objects 500 placed behind display panel 110 having a relatively low light transmittance.

1-4. Configuration Example of Micro-Louver

Next, with reference to FIG. 9 and FIG. 10, a configuration example of a micro-louver which is an optical element, which limits the distribution angle of light, included in illumination unit 200 according to Embodiment 1 will be described.

Figure 9:
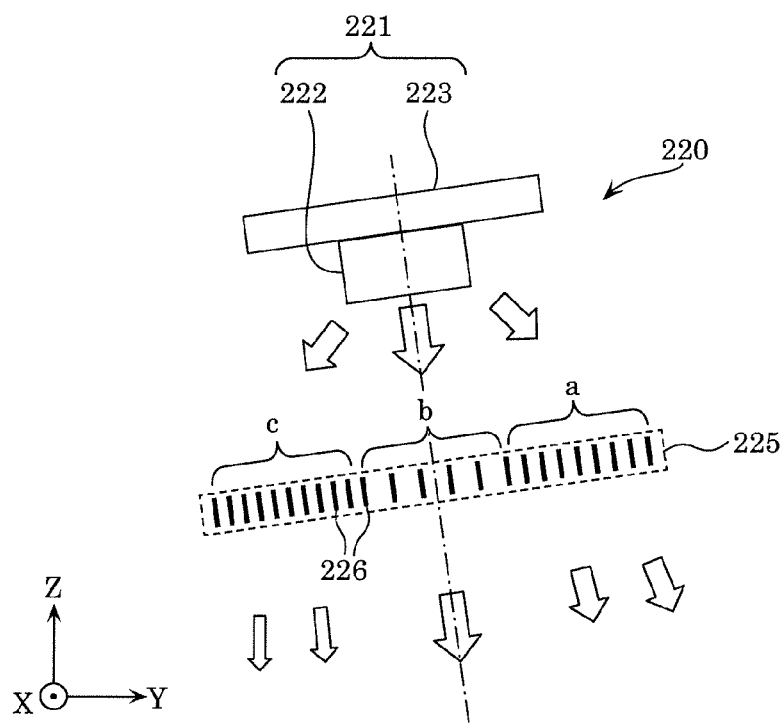
FIG. 9 illustrates a configuration example of a micro-louver according to Embodiment 1.

FIG. 9 illustrates a configuration example of micro-louver 225 according to Embodiment 1. FIG. 10 illustrates an example of a result of light distribution angle control performed by micro-louver 225 illustrated in FIG. 9.

Figure 10:
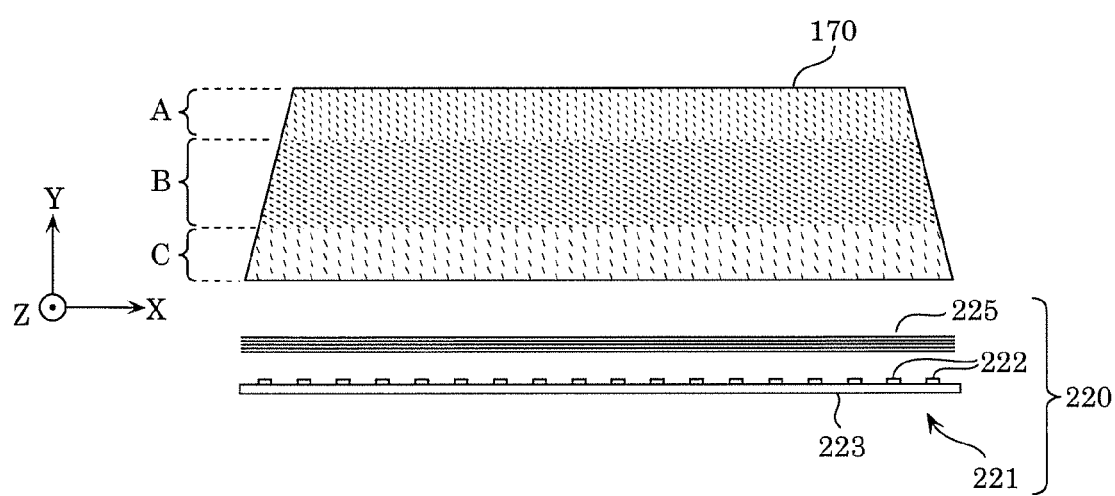
FIG. 10 illustrates an example of a result of light distribution angle control by the micro-louver illustrated in FIG. 9.

Note that FIG. 9, FIG. 10 and the descriptions thereof focus on micro-louver 225 included in upper illumination unit 220. However, the characteristic matters related to micro-louver 225 may be applied to micro-louver 215 included in lower illumination unit 210.

Moreover, the dashed and dotted lines in FIG. 9 represents an optical axis of light source unit 221. Moreover, FIG. 10 schematically illustrates the distribution of light on upper shelf board 170 when upper illumination unit 220 is on by using shading of dots. Darker dots means brighter. Moreover, FIG. 10 schematically illustrates micro-louver 225 and light source unit 221 to represent that micro-louver 225 is disposed between light source unit 221 and upper shelf board 170, and the orientations thereof are different from the actual orientations.

As illustrated in FIG. 9, a plurality of light shields 226 in micro-louver 225 do not have to be arranged at an equal interval in the arrangement direction of light shields 226 (in the short direction of micro-louver 225). For example, as illustrated in FIG. 9, a case is assumed where micro-louver 225 is divided into three regions (regions a, b, c) in the short direction. In this case, the number of light shields 226 per unit length in the short direction in each of regions a, b, c (density: Da, Db, Dc) may be Db<Da<Dc.

In this case, in the short direction, the amount of light emitted from micro-louver 225 is increased by arranging light shields 226 roughly in the central portion of micro-louver 225. In the rear end portion (end portion in the Y-axis plus side) of micro-louver 225, by arranging light shields 226 densely, the amount of light emitted from micro-louver 225 is reduced. In the front end portion (end portion in the Y-axis minus side) of micro-louver 225, by arranging light shields 226 more densely, the amount of light emitted from micro-louver 225 is further reduced.

As a result, the distribution of the amount of light on upper shelf board 170 illuminated by upper illumination unit 220 is schematically represented in FIG. 10. In other words, when the regions of upper shelf board 170 illuminated with light emitted from regions a, b, c of micro-louver 225 are represented by A, B, C, respectively, region B is brightest, and region A is next brightest, and region C is darkest among regions A, B, C. In other words, from the central portion to the rear end in the depth direction (Y-axis direction) of upper shelf board 170, much light is emitted. Accordingly, for example, objects 500 placed on upper shelf board 170 can be efficiently illuminated. Moreover, the amount of unnecessary light emitted rearward beyond upper shelf board 170 is reduced. Moreover, relative to region C which is close to display panel 110, relatively less amount of light is emitted from upper illumination unit 220, and thus, the amount of light emitted from upper illumination unit 220 and entering display panel 110 is reduced. Accordingly, for example, the possibility that display panel 110 looks partially white due to the light from upper illumination unit 220 is reduced.

By adjusting the density of light shields 226 included in micro-louver 225 in this way, the distribution of light emitted to upper shelf board 170 can be adjusted. The configuration of micro-louver 225 illustrated in FIG. 9 is an example. For example, in addition to or in place of density of light shields 226, by changing the inclination of light shields 226, the distribution angle or distribution characteristics of light emitted from upper illumination unit 220 may be adjusted. In other words, one or more light shields 226 among light shields 226 included in micro-louver 225 may be inclined relative to the optical axis of light source unit 221. In other words, the distribution angle or distribution characteristics of light emitted from upper illumination unit 220 may be adjusted by adjusting the inclination of one or more light shields 226.

1-5. Advantageous Effects Etc

As described above, image display device 10 according to the present embodiment includes: image display unit 100 including display panel 110; shelf board 150; and illumination unit 200. Display panel 110 is switchable between an image display mode in which an image is displayed and a transmissive mode in which display panel 110 is in a transmissive state where objects 500 behind image display unit 100 are visible in the front view. Shelf board 150 is disposed projecting rearward from the rear surface of image display unit 100, and extends in the lateral direction. Illumination unit 200 is disposed above shelf board 150, and emits light downward.

With this configuration, objects 500 such as a photograph, a doll, or a vase, can be placed on shelf board 150. In at least the transmissive mode, objects 500 placed behind image display unit 100 can be showed to the user in front of image display unit 100. Moreover, since objects 500 are illuminated with the light from illumination unit 200, even when the transmittance of display panel 110 is not high, illumination sufficient to allow objects 500 to be visible can be provided. In this manner, image display device 10 according to the present embodiment is capable of effectively using display panel 110 which operates in the transmissive mode.

Shelf board 150 extending in the lateral direction can function as a beam reinforcing image display unit 100, for example. Accordingly, for example, the size of image display device 10 can be increased.

Moreover, in image display device 10 according to the present embodiment, illumination unit 200 includes a first illumination unit (upper illumination unit 220) fixed to the upper end portion of the rear surface of image display unit 100.

Specifically, in the present embodiment, upper illumination unit 220 is fixed to T frame 131. Accordingly, for example, in the front view of image display device 10, upper illumination unit 220 which does not need to be shown to the user can be hidden in the upper end portion (T frame 131) of image display unit 100. Moreover, for example, even when display panel 110 is in the transmissive state, since upper illumination unit 220 is embedded in T frame 131 (see FIG. 2), the light emitted from upper illumination unit 220 is not likely to directly enter the eyes of the user in front of display panel 110.

Moreover, in image display device 10 according to the present embodiment, shelf board 150 includes a first shelf board (upper shelf board 170) and a second shelf board (lower shelf board 160) disposed below upper shelf board 170. Illumination unit 200 includes a second illumination unit (lower illumination unit 210) which is disposed at the base portion of upper shelf board 170 and which emits light toward lower shelf board 160.

With this configuration, a plurality of objects 500 can be placed on two tiers of top and bottom shelf boards including upper shelf board 170 and lower shelf board 160, and objects 500 can be efficiently illuminated by two tiers of top and bottom illumination units including upper illumination unit 220 and lower illumination unit 210.

Moreover, in image display device 10 according to the present embodiment, illumination unit 200 includes light source unit 221 which emits light, and an optical element (micro-louver 225) which is disposed on the light-emitting side of light source unit 221 and limits the distribution angle of the light.

With this configuration, upper illumination unit 220 including light source unit 221 is capable of emitting light efficiently toward upper shelf board 170, for example. Specifically, for example, the distribution angle (half directivity angle) of light from LED elements 222 which is approximately 120° can be limited to approximately 60°. Moreover, by using micro-louver 225 including a plurality of light shields 226 as an optical element which limits the light distribution angle, for example, LED elements 222 are less likely to be viewed from the outside. In other words, micro-louver 225 also functions as a member which hides light source unit 221 including LED elements 222 from the outside. Moreover, when LED elements 222 are turned on, the light from each LED element 222 is scattered by light shields 226. As a result, the particulate appearance of light caused by turning on LED elements 222 is unlikely to occur. In the present embodiment, lower illumination unit 210 includes micro-louver 215 which provides the same advantageous effects as micro-louver 225.

Moreover, image display device 10 according to the present embodiment further includes controller 180 which controls operations of display panel 110 and illumination unit 200. When controller 180 operates display panel 110 in a transmissive mode, controller 180 causes illumination unit 200 to emit light. When controller 180 operates display panel 110 in an image display mode, controller 180 causes illumination unit 200 to stop emitting light.

In this manner, in the present embodiment, on and off of illumination unit 200 is appropriately switched according to whether or not controller 180 causes display panel 110 to be in a transmissive state. In other words, in synchronization with switching from the image display mode to the transmissive mode, illumination unit 200 is automatically switched from off to on. Hence, for example, a transition from the image display mode to the transmissive mode is performed smoothly or reliably.

Moreover, in image display device 10 according to the present embodiment, controller 180 is housed in shelf board 150. More specifically, controller 180 is housed inside lower shelf board 160.

Here, each of lower shelf board 160 and upper shelf board 170 forming shelf board 150 is disposed projecting rearward from the rear surface of image display unit 100. In other words, when display panel 110 is in the transmissive state, lower shelf board 160 and upper shelf board 170 are viewed by the user in the orientation along the direction of the eyes of the user. Accordingly, the area of each of lower shelf board 160 and upper shelf board 170 entering the field of view of the user is relatively small. In the present embodiment, controller 180 is housed in lower shelf board 160 disposed in such an orientation which is less likely to be noticed. More specifically, controller 180 including, for example, circuit substrate 181 and a plurality of electric components 182 is housed in lower shelf board 160 in such an orientation that the component mounting surface of circuit substrate 181 is parallel to the front and back direction (Y-axis direction) (in other words, in an upright position relative to the rear surface of image display unit 100). Accordingly, controller 180 required for the operation control of image display device 10 can be disposed behind image display unit 100 operable in a transmissive mode, and can be kept out of sight.

Moreover, in image display device 10 according to the present embodiment, the transmissive mode includes: a first transmissive mode in which display panel 110 is in a transmissive state and an image is not displayed on display panel 110; and a second transmissive mode in which display panel 110 is in a transmissive state and an image (partial image 121) is displayed on a portion of display panel 110.

In other words, image display device 10 according to the present embodiment is capable of operating any one of the first transmissive mode in which the entire image display region on display panel 110 is in the transmissive state, and the second transmissive mode in which only a portion of the image display region is in the transmissive state. Moreover, both the first transmissive mode and the second transmissive mode are transmissive modes. Hence, in the first transmissive mode and the second transmissive mode, illumination unit 200 is on (light illumination state) and each object 500 placed on shelf board 150 is illuminated with the light from illumination unit 200. Moreover, when image display device 10 operates in the second transmissive mode, as illustrated in FIG. 7, it is possible to show virtual objects (partial images 121) and real objects 500 on the same screen to the user at the same time. In other words, image display device 10 is capable of providing AR video which uses one or more objects 500 placed on shelf board 150 to the user.

Partial images 121 each may be numbers, letters, symbols, or any combination thereof for providing some kind of information, such as time display, to the user.

Embodiment 2

Next, with reference to FIG. 11 to FIG. 14, image display device 10a according to Embodiment 2 will be described. In the following description, descriptions of the structural elements and operation details common to those in Embodiment 1 are appropriately omitted, and the differences from Embodiment 1 will be mainly described.

Figure 11:
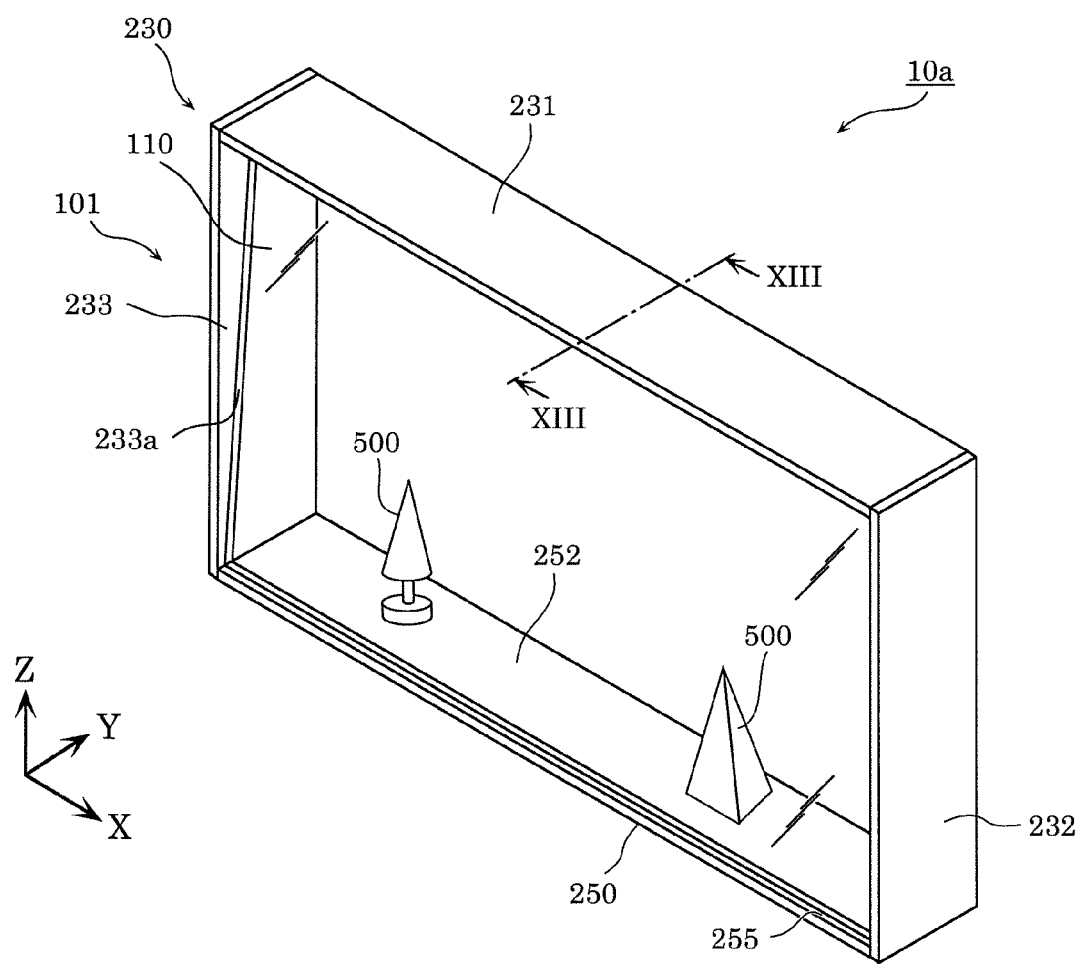
FIG. 11 is an external perspective view of a state of an image display device according to Embodiment 2 when operating in a first transmissive mode.
Figure 12:
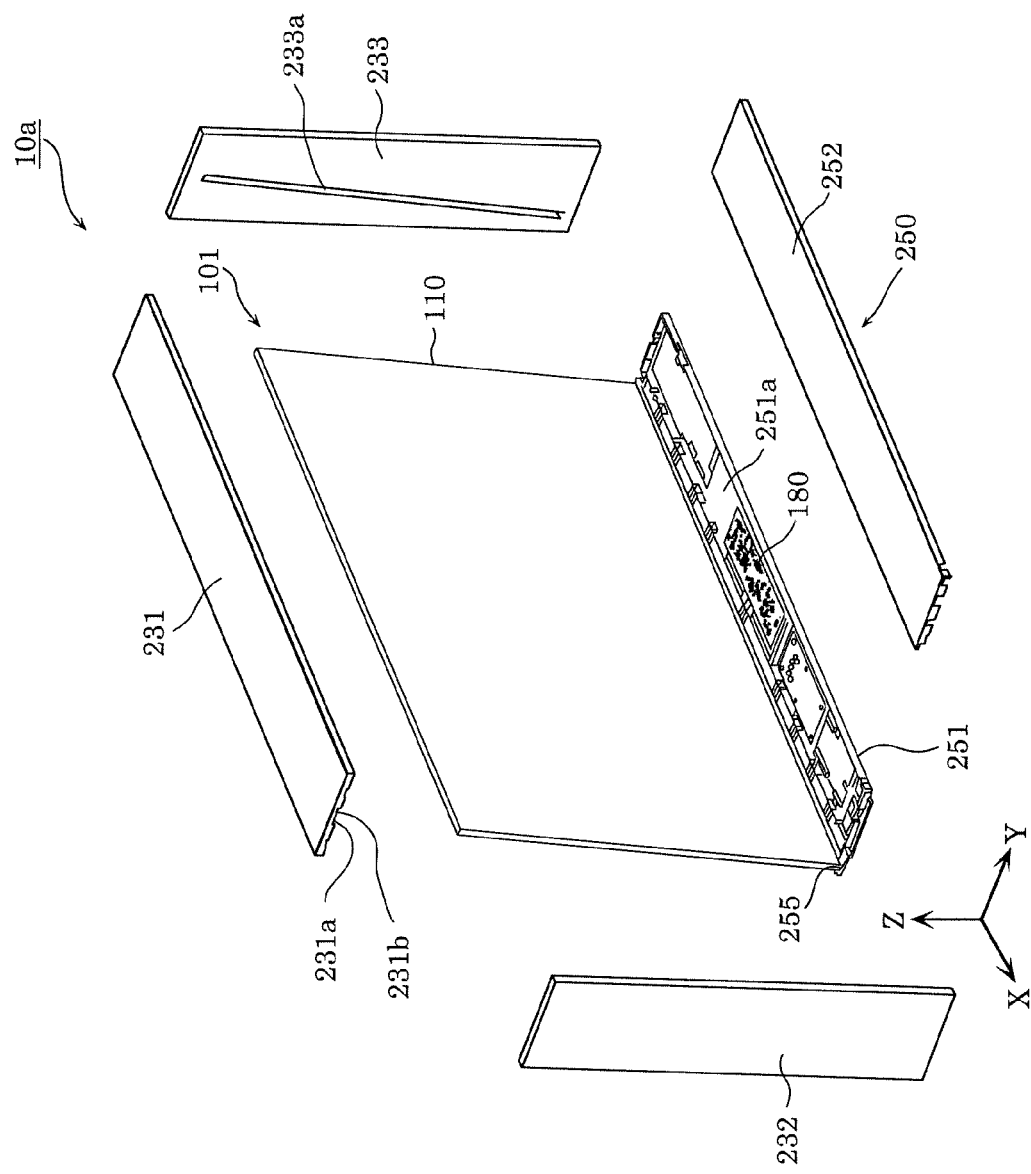
FIG. 12 is an exploded perspective view of a schematic configuration of a shelf board according to Embodiment 2.

FIG. 11 is an external perspective view of image display device 10a according to Embodiment 2 when operating in a first transmissive mode. FIG. 12 is an exploded perspective view of a schematic configuration of shelf board 250 according to Embodiment 2. Specifically, FIG. 12 illustrates shelf board 250 separated into shelf body 251 and placement surface 252.

Figure 13:
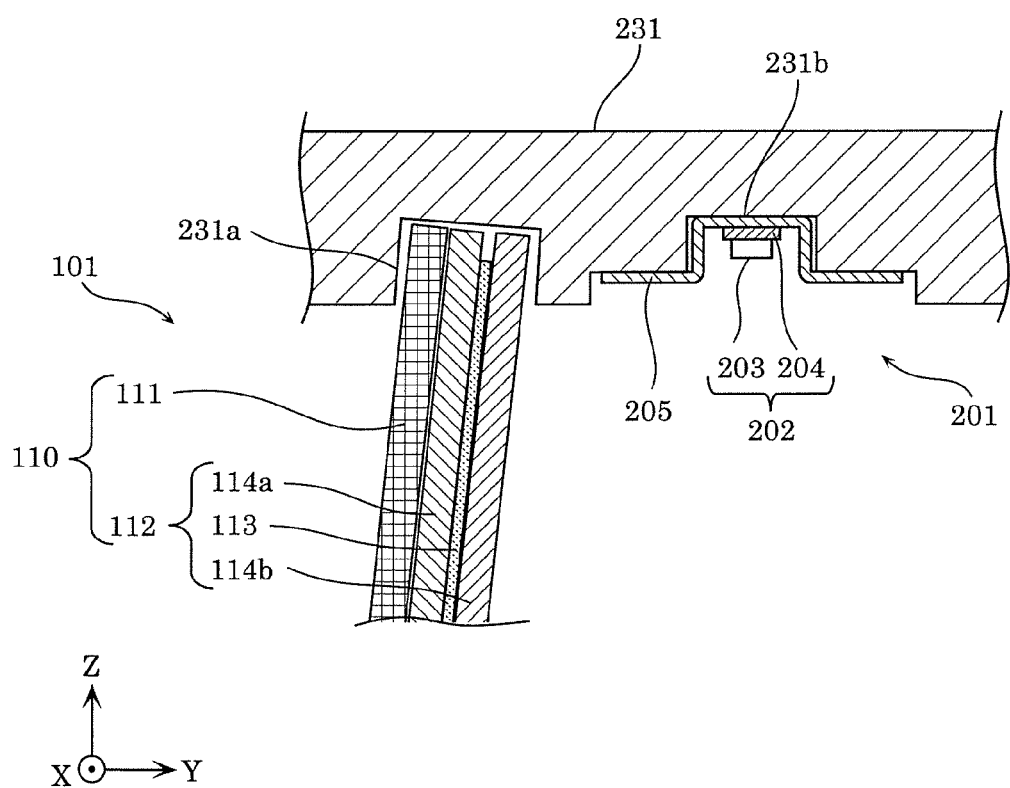
FIG. 13 is a cross-sectional view of a schematic configuration of a display panel and an illumination unit according to Embodiment 2.
Figure 14:
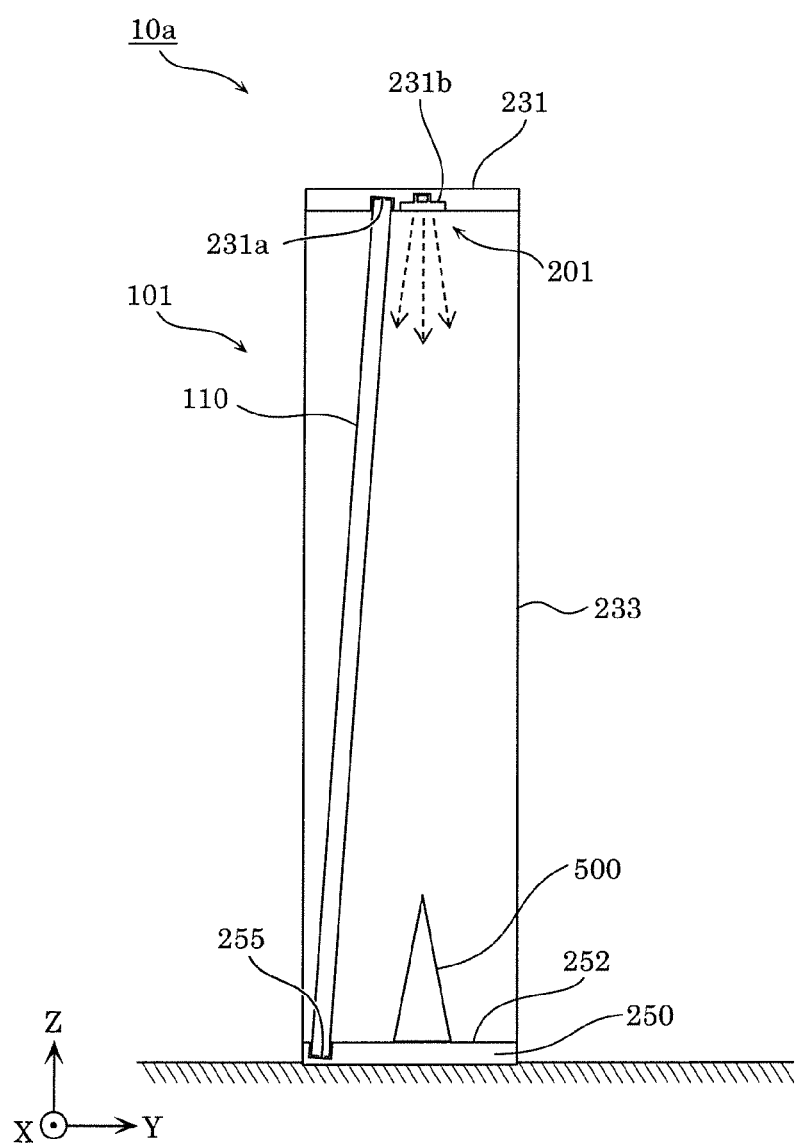
FIG. 14 is a side view of the image display device according to Embodiment 2.

FIG. 13 is a cross-sectional view of a schematic configuration of display panel 110 and illumination unit 201 according to Embodiment 2. Specifically, FIG. 13 illustrates a portion of a cross-section taken along line XIII-XIII in FIG. 11. FIG. 14 is a side view of image display device 10a according to Embodiment 2. In FIG. 14, illustration of right-side wall 232 is omitted, and the side surfaces of display panel 110 and illumination unit 201 are simply illustrated.

As illustrated in FIG. 11 to FIG. 14, image display device 10a according to the present embodiment includes: image display unit 101 including display panel 110; shelf board 150; frame 230; and illumination unit 201. In the present embodiment, image display unit 101 is surrounded, from the outer periphery, and supported by an enclosure member including frame 230 and shelf board 250 and having a rectangular ring shape. Moreover, in the present embodiment, image display unit 101 may include members other than display panel 110, such as a protective panel for protecting the front face of display panel 110, however, the descriptions and illustrations thereof are omitted.

As described in Embodiment 1, display panel 110 is a display device switchable between an image display mode in which an image is displayed and a transmissive mode in which display panel 110 is a transmissive state where objects behind display panel 110 are visible in the front view. As illustrated in FIG. 12, display panel 110 includes organic EL panel 111, and light control panel 112 disposed behind organic EL panel 111. In FIG. 11, display panel 110 is operating in the first transmissive mode, and objects 500 behind display panel 110 are visible from the front side of display panel 110. Moreover, although not illustrated, display panel 110 is also capable of operating in the image display mode (see FIG. 6) and the second transmissive mode (see FIG. 7), and such features of display panel 110 are common between Embodiments 1 and 2.

In the present embodiment, frame 230 includes top wall 231, right-side wall 232, and left-side wall 233. Top wall 231 is disposed along the top side of image display unit 101. Right-side wall 232 is disposed along the right side of image display unit 101 in the front view. Left-side wall 233 is disposed along the left side of image display unit 101 in the front view. Right-side wall 232 is connected to the right end portion of shelf board 250 in the front view, and left-side wall 233 is connected to the left end portion of shelf board 250 in the front view. Top wall 231 is connected to the upper end portions of right-side wall 232 and left-side wall 233. Top wall 231 and shelf board 250 and right-side wall 232 and left-side wall 233 are connected by, for example, screws. In the present embodiment, shelf board 250 is treated as a separate member from frame 230. However, shelf board 250 may be treated as part of frame 230.

As illustrated in FIG. 11 and FIG. 12, left-side wall 233 has holding groove 233a for holding the left edge of image display unit 101 in the front view. In a similar manner, right-side wall 232 has a holding groove (not illustrated) for holding the right edge of image display unit 101 in the front view. As illustrated in FIG. 12 to FIG. 14, top wall 231 has holding groove 231a for holding the upper edge of image display unit 101.

In the present embodiment, each of top wall 231, right-side wall 232, and left-side wall 233 is made of wood. Accordingly, while image display device 10a is operating in the first transmissive mode as illustrated in FIG. 11, image display device 10a is recognized as furniture or display furniture for displaying objects 500 with the front face covered with a glass.

Shelf board 250 is disposed projecting rearward from the rear surface of image display unit 101. Specifically, as illustrated in FIG. 11, FIG. 12, and FIG. 14, shelf board 250 has, at the front end portion, support 255 which supports the lower edge of image display unit 101. Shelf board 250 has a portion which projects rearward from the rear surface of image display unit 101 beyond support 255. Shelf board 250 extends in the lateral direction (left-right direction). Shelf board 250 has a size which supports and covers the entire lower side of image display unit 101.

Objects 500 are placed on placement surface 252 forming the upper face of shelf board 250. Objects 500 are viewed by a user in front of image display device 10a through display panel 110 operating in the first transmissive mode or the second transmissive mode. The transmittance of display panel 110 is, for example, approximately 40% to 50%. Hence, when image display device 10a is placed in a relatively dark environment, the user may fail to clearly view objects 500. In a similar manner to image display device 10 according to Embodiment 1, image display device 10a includes illumination unit 201 which emits illumination light to objects 500.

Illumination unit 201 is disposed at the upper end portion of the rear surface of image display unit 101. Specifically, as illustrated in FIG. 13, top wall 231 has illumination groove 231b for attaching illumination unit 201. Illumination unit 201 includes light source unit 202 which emits light and heat sink 205 for dissipating heat generated by light source unit 202. Heat sink 205 also functions as an attachment member for attaching light source unit 202 to illumination groove 231b. Heat sink 205 is a metal member such as aluminum or aluminum alloy. Light source unit 202 includes substrate 204 long in the X-axis direction and a plurality of LED elements 203 mounted on substrate 204. In a similar manner to illumination unit 200 according to Embodiment 1, on and off of illumination unit 201 are switched in synchronization with the switching of display panel 110 between the transmissive state and the non-transmissive state (for example, see FIG. 8). Accordingly, for example, as illustrated in FIG. 14, objects 500 located below illumination unit 201 are illuminated so that the user is capable of viewing objects 500 more clearly through display panel 110. Moreover, illumination unit 201 is embedded in illumination groove 231b. Accordingly, when display panel 110 is turned into a transmissive state, the light emitted from illumination unit 201 is not likely to directly enter the eyes of the user in front of image display device 10a.

Although not illustrated in FIG. 13, illumination unit 201 according to the present embodiment may include a microlouver which is an optical element which limits the distribution angle of the light from light source unit 202. Accordingly, it is possible to efficiently emit light from light source unit 202 to objects 500. Moreover, the amount of light entering display panel 110 from illumination unit 201 is reduced. This reduces, for example, the possibility that display panel 110 partially looks white due to light from illumination unit 201.

In image display device 10a configured as above, the operations of display panel 110 and illumination unit 201 included in image display unit 101 are controlled by controller 180 held in shelf board 250. Shelf board 250 is an example of a holding member which holds controller 180 in the housed state. Specifically, controller 180 is housed inside shelf board 250 as illustrated in FIG. 12. Controller 180 is disposed along bottom surface 251a of shelf body 251 so that controller 180 falls within the thickness (width in the Z-axis direction) of shelf board 250. In other words, flat plate-shaped controller 180 is housed in shelf board 250 in an upright position relative to the rear surface of image display unit 101 in a similar manner to shelf board 250.

Although not illustrated in FIG. 12, shelf board 250 may house electronic devices such as loudspeaker devices and exhaust fans, in a similar manner to lower shelf board 160 according to Embodiment 1.

As described above, image display device 10a according to the present embodiment includes: image display unit 101 including display panel 110; shelf board 250; and illumination unit 201. Display panel 110 is switchable between an image display mode in which an image is displayed and a transmissive mode in which image display unit 100 is in a transmissive state where objects 500 behind image display unit 100 are visible in the front view. Shelf board 250 is disposed projecting rearward from the rear surface of image display unit 101, and extends in the lateral direction. Illumination unit 201 is disposed above shelf board 250 to emit light downward.

With this configuration, objects 500, such as a photograph, a doll, or a vase, can be placed on shelf board 250. In at least the transmissive mode, objects 500 placed behind image display unit 100 can be displayed to the user in front of image display unit 100. Moreover, since objects 500 are illuminated with light from illumination unit 201, even when the transmittance of display panel 110 is not high, illumination sufficient to allow objects 500 to be visible can be provided. As described, image display device 10a according to the present embodiment is capable of effectively using display panel 110 operating in the transmissive mode.

Moreover, image display device 10a according to the present embodiment further includes, in the front view, right-side wall 232 connected to the right end portion of shelf board 250 and covering image display unit 101 from the right side; left-side wall 233, in the front view, connected to the left end portion of shelf board 250 and covering image display unit 101 from the left side; and top wall 231 connected to the upper end portions of right-side wall 232 and left-side wall 233 and covering image display unit 101 from above.

In this manner, in the present embodiment, image display unit 101 is surrounded by an enclosure member including frame 230 and shelf board 250 and having a rectangular ring shape. As a result, image display device 10a has a simple box shape as a whole. Moreover, shelf board 250 forming the bottom face of image display device 10a has a relatively large area in a plan view. Weights of controller 180, objects 500, and the like are applied downward to shelf board 250. Hence, shelf board 250 can be used as a stand for image display device 10a, and for example, image display device 10a can be placed on the floor surface in a house. Moreover, as described above, for example, frame 230 can be made of wood. This allows image display device 10a to look like furniture or display furniture for displaying objects 500 in a room.

Other Embodiments

As described above, embodiments have been described as examples of the technique disclosed in the present application. However, the technique according to the present disclosure is not limited to these examples, and is applicable to embodiments to which various kinds of modifications, replacements, additions, deletions have appropriately been made. Moreover, each structural element described above may be combined to obtain a new embodiment. Another embodiment will be described below as an example.

For example, display panel 110 according to an embodiment may include a different type of display device from organic EL panel 111, as a display device for displaying an image. Specifically, instead of organic EL panel 111, an inorganic EL panel which is a self-emitting display device like organic EL panel 111 may be included in display panel 110.

Moreover, the second transmissive mode may be treated as one type of "image display mode" because it is an operation mode in which an image is displayed in a portion of display panel 110. For example, it may be that the operation mode of image display device 10 illustrated in FIG. 6 is a "first image display mode", and the operation mode of image display device 10 illustrated in FIG. 7 may be a "second image display mode". In this case, when display panel 110 operates in the image display mode, controller 180 basically causes illumination unit 200 to stop emitting light, and as an exception, causes illumination unit 200 to emit light when display panel 110 operates in the second image display mode. Accordingly, in the same manner as the case where display panel 110 operates in the second transmissive mode, it is possible to allow the user to clearly view objects 500 behind display panel 110 through a portion of display panel 110 where partial images 121 are displayed.

Moreover, shelf board 150 does not always have to include two shelf boards (upper shelf board 170 and lower shelf board 160) disposed away from each other in the vertical direction. For example, shelf board 150 may only include lower shelf board 160. In other words, only lower shelf board 160 may be treated as shelf board 150.

Moreover, shelf board 150 may include three or more shelf boards separated from each other in the vertical or lateral direction. In any case, it is sufficient that illumination unit 200 is disposed so as to illuminate objects 500 placed on each of one or more shelf boards included in shelf board 150. In other words, illumination unit 200 does not always have to include two illumination units (upper illumination unit 220 and lower illumination unit 210) disposed away from each other in the vertical direction. It is sufficient that illumination unit 200 includes one or more illumination units so as to emit light toward each of the shelf boards included in shelf board 150 and physically separated from each other.

Moreover, the optical element which is included in upper illumination unit 220 and which limits the distribution angle of light from light source unit 221 may be a different type of optical element (such as lens or reflective plate) from the micro-louver. In a similar manner to lower illumination unit 210, for example, a lens or a reflective plate may be used as an optical element.

Moreover, for example, a third illumination unit may be disposed at the base portion of lower shelf board 160 (at the end closer to light transmissive panel 300) such that the optical axis is directed diagonally downward. Accordingly, for example, objects 500 placed behind light transmissive panel 300 can be illuminated by the third illumination unit. In this case, a shelf board for placing objects 500 (third shelf board) may be disposed behind light transmissive panel 300. In this case, for example, in synchronization with switching of display panel 110 between the transmissive state and the non-transmissive state, on and off of the third illumination unit may be switched. Moreover, the third illumination unit may be always on when the main power of image display device 10 is on.

Moreover, it has been described that light control sheet 113 according to Embodiments 1 and 2 can be switched from the non-transmissive state to the transmissive state by an application of a predetermined voltage (by turning on light control sheet 113). However, light control sheet 113 may be switched from the transmissive state to the non-transmissive state by an application of a predetermined voltage. In this case, for example, even when the main power of image display device 10 is off, light control sheet 113 is maintained in the transmissive state. Accordingly, even when the main power of image display device 10 is off, it is possible to allow the user in front of display panel 110 to view objects 500 placed behind display panel 110 through display panel 110. In this case, in order to illuminate objects 500, image display device 10 may include an electric circuit which is capable of turning on illumination unit 200 (causing illumination unit 200 to illuminate) even when the main power of image display device 10 is off.

Moreover, the material of frame 130 does not have to be metal such as aluminum or aluminum alloy. For example, resin may be used as the material of frame 130.

Moreover, in Embodiment 1, a holding member for holding controller 180 is lower shelf board 160. However, the holding member for holding controller 180 does not have to be a shelf board on which one or more objects 500 can be placed. For example, controller 180 may be held in a flat plate shaped case disposed projecting rearward from the rear surface of image display unit 100. In this case, the case may have a shape, an orientation, a size or a strength which does not allow one or more objects 500 to be placed on the case or which is unsuitable for such a placement. Even in this case, since the case is disposed projecting rearward from the rear surface of image display unit 100, the case has an orientation which is less likely to be noticed in the front view of display panel 110 operating in the transmissive mode. Accordingly, controller 180 required for the operation control of image display device 10 can be disposed behind image display unit 100 operable in the transmissive mode, and can be kept out of sight.

Moreover, display panel 110 does not have to include light control panel 112. In this case, in the image display mode, clarity of the displayed image may be reduced because light control panel 112 does not shield entrance of light from the rear surface of organic EL panel 111. However, in the first transmissive mode and the second transmissive mode, loss of the light transmittance by light control panel 112 is eliminated, and thus, clarity of objects 500 when viewed through display panel 110 is improved.

Moreover, the supplementary notes related to Embodiment 1 described above may be applied to Embodiment 2. For example, right-side wall 232 or left-side wall 233 instead of shelf board 250 may function as a holding member for holding controller 180. In this case, a connector which makes connection with an external device can be disposed in a relatively large area in the right surface or the left surface of image display device 10a.

Moreover, for example, image display device 10a according to Embodiment 2 may include a plurality of shelf boards disposed separately from each other in the vertical direction. For example, in image display device 10a, shelf board 250 may include a lower shelf board disposed at the position of current shelf board 250, and an upper shelf board disposed between the lower shelf board and top wall 231. In this case, in a similar manner to illumination unit 200 according to Embodiment 1, illumination unit 201 may include an upper illumination unit for illuminating objects 500 placed on the upper shelf board and a lower illumination unit for illuminating objects 500 placed on the lower shelf board. Moreover, in this case, one of the lower shelf board and the upper shelf board may hold controller 180.

Moreover, frame 230 according to Embodiment 2 does not have to be made of wood. For example, at least a portion of each of top wall 231, right-side wall 232, and left-side wall 233 may be made of resin or metal.

Moreover, image display device 10a according to Embodiment 2 may include a stand or the like for placing image display device 10a below shelf board 250. The placement of image display device 10a is not particularly limited. For example, image display device 10a may be attached to the wall surface by, for example, a wall hanging unit.

Moreover, image display unit 101 may be placed in one section of a rack having a plurality of sections arranged in the vertical or lateral direction where objects 500 can be placed. Accordingly, it is possible to configure an image display device (or a rack) such that exhibition of objects 500 and display of an image can be performed in at least one section, and objects 500 can be exhibited or housed by using another one or more sections.

Moreover, objects 500 do not always have to be placed on shelf boards 150 and 250. Shelf board 150 may function only as a portion of the building frame of image display device 10, and shelf board 250 may function only as a portion of the building frame of image display device 10a. Moreover, illumination units 200 and 201 may be used not for illuminating objects 500 below, but for illuminating a space where image display device 10 or 10a is placed (indirect lighting)

Moreover, in image display devices 10 and 10a, controller 180 may be disposed outside image display devices 10 and 10a. For example, in order to reduce the thickness of lower shelf board 160, an electronic device, such as controller 180, may be housed in a housing separate from image display device 10. In order to reduce the thickness of shelf board 250, an electronic device, such as controller 180, may be housed in a housing separate from image display device 10a.

As described above, embodiments have been described as examples of the technique disclosed in the present disclosure. For this purpose, the accompanying drawings and detailed description are provided.

Accordingly, the structural elements described in the accompanying drawings and detailed description may include not only structural elements which are essential for solving the problem but also structural elements which are not essential for solving the problem but are provided for illustrating the technique. Therefore, the non-essential structural elements described in the accompanying drawings and/or the detailed description should not be instantly acknowledged to be essential structural elements.

Since the above embodiments are intended to illustrate the technique in the present disclosure, it is possible to make various kinds of modifications, replacements, additions, deletions, and the like within the scope of the claims or an equivalent scope thereof.

INDUSTRIAL APPLICABILITY

The present disclosure is applicable to an image display device, such as a television receiver, a monitor display, or a digital signage.

The invention claimed is:
1. An image display device, comprising:
an image display unit which includes a display panel switchable between an image display mode and a transmissive mode, the image display mode being a mode in which an image is displayed, the transmissive mode being a mode in which the display panel is in a transmissive state where an object behind the image display unit is visible in a front view of the display panel;
a shelf board which is disposed projecting rearward from a rear surface of the image display unit, the shelf board extending in a lateral direction; and
an illumination unit which is disposed above the shelf board and emits light downward,
wherein, in the image display mode, the illumination unit is turned off such that no light from any illumination unit within the image display unit is incident on a rear surface of the display panel.

2. The image display device according to claim 1, wherein the illumination unit includes a first illumination unit fixed to an upper end portion of the rear surface of the image display unit.

3. The image display device according to claim 2,
wherein the shelf board includes a first shelf board and a second shelf board disposed below the first shelf board, and
the illumination unit includes a second illumination unit disposed at a base portion of the first shelf board, the second illumination unit emitting light toward the second shelf board.

4. The image display device according to claim 1,
wherein the illumination unit includes:
a light source unit which emits light; and
an optical element which is disposed on a light-emitting side of the light source unit and limits a distribution angle of the light.

5. The image display device according to claim 1, further comprising:
a controller which controls an operation of the display panel and an operation of the illumination unit,
wherein the controller causes the illumination unit to emit light when the controller causes the display panel to operate in the transmissive mode, and causes the illumination unit to stop emitting light when the controller causes the display panel to operate in the image display mode.

6. The image display device according to claim 5, wherein the controller is housed in the shelf board.

7. The image display device according to claim 1, wherein the transmissive mode includes a first transmissive mode and a second transmissive mode, the first transmissive mode being a mode in which the display panel is in the transmissive state and the image is not displayed on the display panel, the second transmissive mode being a mode in which the display panel is in the transmissive state and the image is displayed only on a portion of the display panel.

8. The image display device according to claim 1, further comprising:
a right-side wall connected to a right end portion of the shelf board and covering the image display unit from a right side, in the front view;
a left-side wall connected to a left end portion of the shelf board and covering the image display unit from a left side, in the front view; and
a top wall connected to an upper end portion of each of the right-side wall and the left-side wall, and covering the image display unit from above.

* * * * *